US010706188B1

(12) United States Patent
von Davier

(10) Patent No.: US 10,706,188 B1
(45) Date of Patent: Jul. 7, 2020

(54) PARALLEL COMPUTING FOR DATA ANALYSIS USING GENERALIZED LATENT VARIABLE MODELS

(71) Applicant: Educational Testing Service, Princeton, NJ (US)

(72) Inventor: Matthias von Davier, Lawrenceville, NJ (US)

(73) Assignee: Educational Testing Service, Princeton, NJ (US)

(*) Notice: Subject to any disclaimer, the term of this patent is extended or adjusted under 35 U.S.C. 154(b) by 724 days.

(21) Appl. No.: 15/348,083

(22) Filed: Nov. 10, 2016

Related U.S. Application Data

(60) Provisional application No. 62/254,327, filed on Nov. 12, 2015.

(51) Int. Cl.
*G06F 30/20* (2020.01)
*G06N 20/00* (2019.01)

(52) U.S. Cl.
CPC .............. *G06F 30/20* (2020.01); *G06N 20/00* (2019.01)

(58) Field of Classification Search
CPC ...... G06F 17/5009; G06F 30/20; G06N 20/00
USPC ............................................................ 703/2
See application file for complete search history.

(56) References Cited

U.S. PATENT DOCUMENTS

| 8,005,712 | B2 | 8/2011 | von Davier et al. | |
|---|---|---|---|---|
| 8,639,176 | B2 | 1/2014 | von Davier et al. | |
| 2013/0084008 | A1* | 4/2013 | Othmezouri | G06K 9/6297 382/180 |

OTHER PUBLICATIONS

Yang, Renyong, et al. "DISTRIM: parallel GMM learning on multicore cluster." 2012 IEEE International Conference on Computer Science and Automation Engineering (CSAE). vol. 2. IEEE, 2012. pp. 630-635. (Year: 2012).*

Ferguson, Kimberly, et al. "Improving intelligent tutoring systems: Using expectation maximization to learn student skill levels." International Conference on Intelligent Tutoring Systems. Springer, Berlin, Heidelberg, 2006. pp. 453-462. (Year: 2006).*

Yang, Renyong, et al. "DISTRIM: parallel GMM learning on multicore cluster." 2012 IEEE International Conference on Computer Science and Automation Engineering (CSAE). vol. 2. IEEE, 2012. pp. 630-635. (Year: 2012).*

(Continued)

*Primary Examiner* — Kamini S Shah
*Assistant Examiner* — John E Johansen
(74) *Attorney, Agent, or Firm* — Jones Day

(57) ABSTRACT

Systems and methods are provided for implementing a parallel Expectation Minimization algorithm for generalized latent variable models. Item response data that is based on responses to items from multiple respondents is accessed. The item response data includes data for multiple response variables. The item response data is analyzed using a generalized latent variable model, and the analysis includes an application of a Parallel-E Parallel-M (PEPM) algorithm. In a parallel Expectation step of the PEPM algorithm, the respondents are subdivided into N groups of respondents, and computations for the N groups are performed in parallel using the N processor cores. In a parallel Maximization step of the PEPM algorithm, the response variables are subdivided into N groups of response variables, and computations for the N groups of response variables are performed in parallel using the N processor cores.

17 Claims, 9 Drawing Sheets

(56) References Cited

OTHER PUBLICATIONS

Ferguson, Kimberly, et al. "Improving intelligent tutoring systems: Using expectation maximization to learn student skill levels." International Conference on Intelligent Tutoring Systems. Springer, Berlin, Heidelberg, 2006. pp. 453-462. (Year: 2006).*
Cai, Li; Metropolis-Hastings Robbins-Monro Algorithm for Confirmatory Item Factor Analysis; Journal of Educational and Behavioral Statistics, 35(3); pp. 307-335; Jun. 2010.
Cai, Li; A Two-Tier Full-Information Item Factor Analysis Model with Applications; Psychometrika, 75(4); pp. 581-612; Dec. 2010.
Cai, Li; High-Dimensional Exploratory Item Factor Analysis by a Metropolis-Hastings Robbins-Monro Algorithm; Psychometrika, 75(1); pp. 33-57; Mar. 2010.
Das, Abhinandan, Datar, Mayur, Garg, Ashutosh, Rajaram, Shyam; Google News Personalization: Scalable Online Collaborative Filtering; Proceedings of the 16th International Conference on World Wide Web; pp. 271-280; May 2007.
Dempster, A.P., Laird, N.M., Rubin, D.B.; Maximum Likelihood from Incomplete Data Via the EM Algorithm; Journal of the Royal Statistical Society, 39(1); pp. 1-38; 1977.
Gilula, Zvi, Haberman, Shelby; Conditional Log-Linear Models for Analyzing Categorical Panel Data; Journal of the American Statistical Association; 89(426); pp. 645-656; Jun. 1994.
Jeon, Minjeong, Rijmen, Frank, Rabe-Hesketh, Sophia; Modeling Differential Item Functioning Using a Generalization of the Multiple-Group Bifactor Model; Journal of Educational and Behavioral Statistics, 38(1); pp. 32-60; Feb. 2013.
Lopez-De-Teruel, P.E., Garcia, J.M., Acacio, M.; The Parallel EM Algorithm and its Applications in Computer Vision; PDPTA Conference; pp. 571-578; 1999.
Molenaar, Ivo; Some Improved Diagnostics for Failure of the Rasch Model; Psychometrika, 48(1); pp. 49-72; Mar. 1983.
Oliveri, Maria Elena, Von Davier, Matthias; Toward Increasing Fairness in Score Scale Calibrations Employed in International Large-Scale Assessments; International Journal of Testing, 14(1); pp. 1-21; 2014.

Rijmen, Frank, Jeon, Minjeong; Fitting an Item Response Theory Model with Random Item Effects Across Groups by a Variational Approximation Method; Annals of Operations Research, 206(1); pp. 647-662; Jul. 2013.
Rijmen, Frank, Jeon, Minjeong, Von Davier, Matthias, Rabe-Hesketh, Sophia; A Third-Order Item Response Theory Model for Modeling the Effects of Domains and Subdomains in Large-Scale Educational Assessment Surveys; Journal of Education and Behavioral Statistics, 39(4); pp. 235-256; 2014.
Rost, Jurgen, Von Davier, Matthias; A Conditional Item-Fit Index for Rasch Models; Applied Psychological Measurement, 18(2); pp. 171-182; Jun. 1994.
Vermunt, Jeroen, Van Ginkel, Joost, Van Der Ark, L. Andries, Sijtsm, Klaas; Multiple Imputation of Incomplete Categorical Data Using Latent Class Analysis; Social Methodology, 38; pp. 369-397; 2008.
Von Davier, Matthias; A General Diagnostic Model Applied to Language Testing Data; British Journal of Mathematical and Statistical Psychology, 61(2); pp. 287-307; 2008.
Von Davier, Matthias; Some Notes on the Reinvention of Latent Structure Models as Diagnostic Classification Models; Measurement Interdisciplinary Research and Perspectives, 7(1); pp. 67-74; 2009.
Von Davier, Matthias; The DINA Model as a Constrained General Diagnostic Model: Two Variants of a Model Equivalency; British Journal of Mathematical and Statistical Psychology, 67; pp. 49-71; 2014.
Von Davier, Matthias, Molenaar, Ivo; A Person-Fit Index for Polytomous Rasch Models, Latent Class Models, and Their Mixture Generalizations; Psychometrika, 68(2); pp. 213-228; Jun. 2003.
Von Davier, Matthias, Xu, Xueli, Carstensen, Claus; Measuring Growth in a Longitudinal Large-Scale Assessment with a General Latent Variable Model; Psychometrika, 76(2); pp. 318-336; Apr. 2011.
Von Davier, Matthias, Rost, Jurgen; Mixture Distribution Item Response Models; Handbook of Statistics, 26; pp. 643-661; 2006.
Wetzel, Eunike, Xu, Xueli, Von Davier, Matthias; An Alternative Way to Model Population Ability Distributions in Large-Scale Educational Surveys; Educational and Psychological Measurement, 75(5); pp. 739-763; 2014.

* cited by examiner

Amdahl's Law: Execution time speedup as a function of number of processing cores. The lines represent different proportions of the sequential part of the algorithm.

*Test cases used in the comparison of sequential and parallel algorithm*

| Case | Scales | Model | Groups | Items | Sample | QPT | Total categories QPT | |
|---|---|---|---|---|---|---|---|---|
| A | 1 | IRT-2PL/GPCM | 312 | 293 | 1614281 | 21 | 21 | 2-4 |
| B | 1 | IRT-2PL/GPCM | 283 | 133 | 1803599 | 21 | 21 | 4 |
| C | 7 | GDM (MTMM) | 1 | 214 | 7377 | 3 | 2187 | 3 |
| D | 2 | MIRT (Simple) | 1 | 175 | 5763 | 15 | 225 | 3 |
| E | 2 | MIRT (Simple) | 1 | 175 | 5763 | 31 | 961 | 3 |
| F | NA | LCA | 54 | 54 | 246112 | 1 | 1 | 6 |
| G | 5 | MIRT | 1 | 150 | 2026 | 5 | 3125 | 2 |

Abbreviations: 2PL (two-parameter logistic); GDM (general diagnostic model), GPCM (generalized partial credit model); IRT (item response theory), LCA (latent class analysis), multiple item response theory (MIRT), multitrait-multimethod (MTMM), quadrature points (QPT).).

FIG. 5

*Results for the i7 2GHz serial vs. parallel algorithm*

|      | i7 serial | | | | i7 parallel | | | |
| --- | --- | --- | --- | --- | --- | --- | --- | --- |
| case | iter. | likelihood | sec. | | case | iter. | likelihood | sec. | speedup |
| A | 632 | -14547736.00 | 9417 | | A | 632 | -14547736.00 | 4432 | 2.12 |
| B | 355 | -14643301.39 | 4692 | | B | 355 | -14643301.39 | 2094 | 2.24 |
| C | 402 | -12397014 | 3474 | | C | 402 | -12397014 | 2044 | 1.70 |
| D | 231 | -14471027.63 | 109 | | D | 231 | -14471027.63 | 120 | 0.91 |
| E | 232 | -14471063.17 | 1111 | | E | 232 | -14471063.17 | 882 | 1.26 |
| F | 806 | -1234818.85 | 2299 | | F | 806 | -1234818.85 | 1179 | 1.95 |
| G | 800 | -131430.87 | 3629 | | G | 800 | -131430.87 | 2890 | 1.26 |

FIG. 6

*Results for the Xeon 2 x 6 3.07GHz serial vs. parallel algorithm*

| | Xeon 12 Single Core | | | | Xeon X12 Parallel | | |
|---|---|---|---|---|---|---|---|
| case | iter. | likelihood | sec. | case | iter. | likelihood | sec. speedup |
| A | 632 | -14547736.00 | 11417 | A | 632 | -14547736.00 | 2241 5.09 |
| B | 355 | -14643301.39 | 5456 | B | 355 | -14643301.39 | 799 6.83 |
| C | 402 | -123970.14 | 3755 | C | 402 | -123970.14 | 980 3.83 |
| D | 231 | -1234818.85 | 139 | D | 231 | -1234818.85 | 32 4.34 |
| E | 232 | -131430.87 | 969 | E | 232 | -131430.87 | 407 2.38 |
| F | 806 | -144710127.63 | 4225 | F | 806 | -144710127.63 | 830 5.09 |
| G | 800 | -144471063.17 | 14619 | G | 800 | -144471063.17 | 2769 5.28 |

FIG. 7

*A comparison of parallel EM performance between a 12-core Xeon workstation and an i7 laptop computer*

| Case | Iterations | Likelihood | Xeon 12 Core | i7 Laptop | Speedup |
|------|-----------|------------|--------------|-----------|---------|
| A | 632 | -145477736.00 | 2241 | 4432 | 1.98 |
| B | 355 | -146433301.39 | 799 | 2094 | 2.62 |
| C | 402 | -123970.14 | 980 | 2044 | 2.09 |
| D | 231 | -144471027.63 | 32 | 120 | 1.42 |
| E | 232 | -144471063.17 | 407 | 882 | 1.04 |
| F | 806 | -1234818.85 | 830 | 1179 | 3.75 |
| G | 800 | -131430.87 | 2769 | 2890 | 2.17 |

FIG. 8

PARALLEL COMPUTING FOR DATA ANALYSIS USING GENERALIZED LATENT VARIABLE MODELS

CROSS-REFERENCE TO RELATED APPLICATIONS

The application claims priority to U.S. Provisional Application No. 62/254,327, filed Nov. 12, 2015, entitled "Parallel Computing for Data Analysis Using Generalized Latent Variable Models," the entirety of which is herein incorporated by reference.

FIELD

The technology described in this patent document relates generally to data analysis and more particularly to a parallel Expectation Maximization (EM) algorithm for generalized latent variable models.

BACKGROUND

Latent variable models are frequently applied to the analysis of responses from test-takers to a set of items, for example, in the context of proficiency testing. Latent variable models that are used for this purpose include item response theory models, diagnostic classification models, multitrait-multimethod models, and discrete mixture distribution models, among others. The National Assessment of Educational Progress (NAEP), the Programme for International Student Assessment (PISA), the Test of English as a Foreign Language (TOEFL), and the Graduate Record Examinations (GRE) are examples of examinations that use item response theory (IRT) or some specific form of multidimensional item response theory (MIRT).

SUMMARY

The present disclosure is directed to systems and methods for implementing a Parallel-E Parallel-M (PEPM) algorithm for generalized latent variable models. In an example computer-implemented method performed in a computer system including N processor cores, item response data that is based on responses to items from multiple respondents is accessed. The item response data includes data for multiple response variables. The item response data is analyzed using a generalized latent variable model, and the analysis includes an application of the PEPM algorithm. In a parallel Expectation step of the PEPM algorithm, the respondents are subdivided into N groups of respondents, and computations for the N groups are performed in parallel using the N processor cores. Data for each of the N groups is processed by a respective core of the N processor cores, where the computations include, for each of the multiple respondents, calculating the posterior of the latent variable given responses. In a parallel Maximization step of the PEPM algorithm, the response variables are subdivided into N groups of response variables, and computations for the N groups of response variables are performed in parallel using the N processor cores. Data for each of the N groups is processed by a respective core of the N processor cores, where the computations include, for each response variable of the multiple response variables, updating the parameters associated with the response variable.

An example system includes a processing system including N processor cores and one or more non-transitory computer-readable storage mediums. The one or more non-transitory computer-readable storage mediums are in communication with the processing system and are encoded with instructions for commanding the processing system to execute steps. In executing the steps, item response data that is based on responses to items from multiple respondents is accessed. The item response data includes data for multiple response variables. The item response data is analyzed using a generalized latent variable model, and the analysis includes an application of the PEPM algorithm. In a parallel Expectation step of the PEPM algorithm, the respondents are subdivided into N groups of respondents, and computations for the N groups are performed in parallel using the N processor cores. Data for each of the N groups is processed by a respective core of the N processor cores, where the computations include, for each of the multiple respondents, calculating the posterior of the latent variable given responses. In a parallel Maximization step of the PEPM algorithm, the response variables are subdivided into N groups of response variables, and computations for the N groups of response variables are performed in parallel using the N processor cores. Data for each of the N groups is processed by a respective core of the N processor cores, where the computations include, for each response variable of the multiple response variables, updating parameters associated with the response variable.

An example non-transitory computer-readable storage medium includes computer executable instructions which, when executed, cause a processing system including N processor cores to execute steps. In executing the steps, item response data that is based on responses to items from multiple respondents is accessed. The item response data includes data for multiple response variables. The item response data is analyzed using a generalized latent variable model, and the analysis includes an application of the PEPM algorithm. In a parallel Expectation step of the PEPM algorithm, the respondents are subdivided into N groups of respondents, and computations for the N groups are performed in parallel using the N processor cores. Data for each of the N groups is processed by a respective core of the N processor cores, where the computations include, for each of the multiple respondents, calculating the posterior of the latent variable given responses. In a parallel Maximization step of the PEPM algorithm, the response variables are subdivided into N groups of response variables, and computations for the N groups of response variables are performed in parallel using the N processor cores. Data for each of the N groups is processed by a respective core of the N processor cores, where the computations include, for each response variable of the multiple response variables, updating the parameters associated with each response variable.

BRIEF DESCRIPTION OF THE DRAWINGS

FIG. 5 is a table including data on test cases used in the comparison of sequential and parallel algorithms.

FIG. 6 is a table including results for the i7 2 GHz, serial versus parallel algorithms.

FIG. 7 is a table including results for the Xeon 2×6 3.33 GHz, serial versus parallel algorithms.

FIG. 8 is a table including data showing a comparison of PEPM algorithm performance between a 12-core Xeon workstation and an i7 laptop computer.

DETAILED DESCRIPTION

Figure 1A:
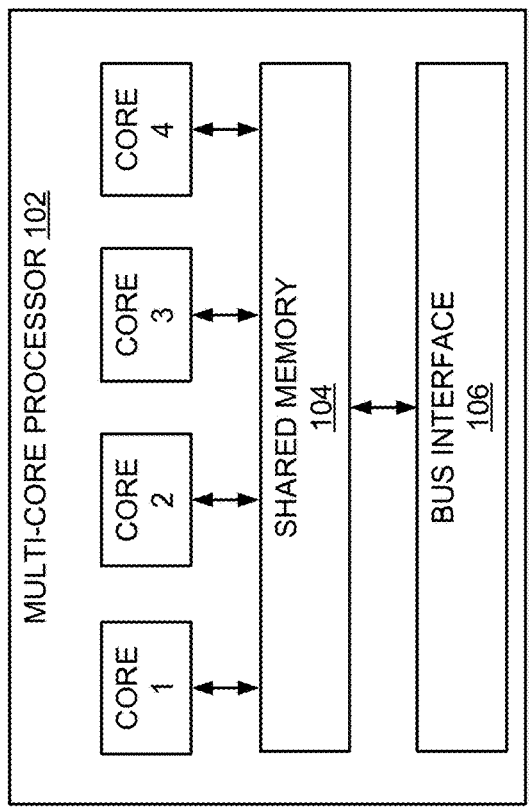
FIG. 1A depicts example item response data that may be analyzed using the systems and methods described herein.

Generalized latent variable models are frequently applied to the analysis of multidimensional responses from test-takers to a set of items, for example, in the context of proficiency testing. Such generalized latent variable models are suitable for analyzing item response data that is based on responses to items from multiple respondents (e.g., test-takers). FIG. 1A depicts example item response data that may be analyzed using the systems and methods described herein. The item response data includes a column 120 for "Respondent Identifier," which lists identifiers for multiple respondents that took examinations. The respondent identifier may include a name, number, or other data that can be used in identifying a respondent. In the example of FIG. 1A, rows 132, 134, 136 include data for three different respondents.

The item response data of FIG. 1A further includes columns 122, 124, 126, 128 corresponding to items (e.g., test questions) which may appear on an examination. In the example of FIG. 1A, an entry of "1" for a given respondent and item indicates that the respondent took an examination including the item and answered the item correctly. Conversely, an entry of "0" for a given respondent and item indicates that the respondent took an examination including the item and answered the item incorrectly. An empty entry for a given respondent and item indicates that the examination taken by the respondent did not include the item. Empty entries may result from an examination changing over time, among other reasons. For example, questions of an examination may be phased out over time, such that respondents that took the examination in the past have data for such questions, while respondents that took the examination more recently do not.

In FIG. 1A, a respondent having respondent ID "1103323" (i.e., as listed in the row 132) took an examination including Items 001, 003, and 004. The respondent answered Items 001 and 004 correctly and answered Item 003 incorrectly. The examination taken by the respondent did not include Item 002. It is thus noted that the item response data of FIG. 1A includes a "quilt" or "patchwork" pattern, with some entries being empty and others including data. The table of FIG. 1A may include various other data not shown in the figure. For example, the table may include data indicating group and/or population memberships of the respondents and various other data (e.g., weights, etc.). It is thus noted that the table depicted in FIG. 1A is only an example, and that various data may be included in the item response data in other examples.

The Items 001, 002, 003, 004 represented by the column headers of FIG. 1A are examples of response variables. As noted above, these response variables indicate whether a respondent answered an item correctly or incorrectly. Respondents may have data for various other response variables not shown in FIG. 1A. For example, other response variables may be related to a respondent's timing in answering a test item. Thus, a response variable may include an indication of an amount of time used by a test-taker in answering a test item, in an example. Other response variables may be related to a respondent's action in answering a test item. For example, in a test item where the test-taker can use different actions to aid his completion of the test item (e.g., pressing a search button, using a scroll bar, pressing a help button, switching between tabs, etc.), a response variable may include an indication of an action performed by the test-taker (e.g., a binary indication of whether or not the test-taker performed a particular action). The item response data may include data for various other response variables.

The item response data of FIG. 1A thus includes data for multiple respondents and multiple response variables. It is noted that the dataset shown in FIG. 1A is small and not representative of the very large datasets that are commonly analyzed. Such datasets may include data for hundreds, thousands, or millions of respondents. Thus, although the item response data of FIG. 1A shows three rows of data for three respondents, it should be understood that datasets commonly include hundreds, thousands, or millions of rows for respondents. Datasets may further include data for a large number of response variables. Thus, although the item response data of FIG. 1A shows four columns for four response variables, it should be understood that datasets commonly include several hundreds or thousands of columns for response variables. Such datasets may have sizes in the tens or hundreds of megabytes or several gigabytes, for example, including data from very large numbers of respondents, up to millions in international programs for assessing in-school populations of students.

Figure 1B:
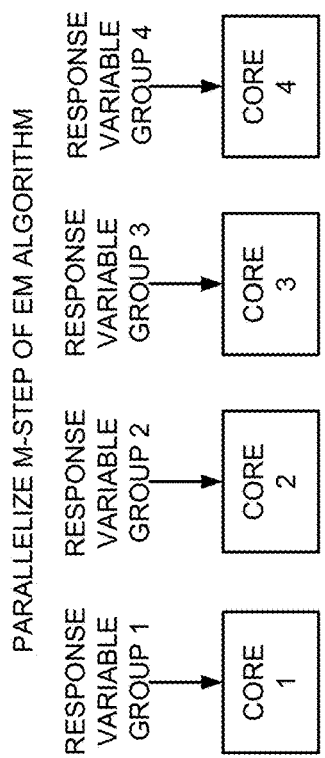
FIG. 1B depicts a multi-core processor comprising multiple processor cores.

Generalized latent variable models may be used in analyzing item response data such as that depicted in FIG. 1A, as noted above. In the approaches described herein, the analysis includes an application of a parallel Expectation Maximization (EM) algorithm (referred to herein as a Parallel-E Parallel-M (PEPM) algorithm) that enables a distribution of work (e.g., calculations) onto multiple processing cores. Under these approaches, the architecture of modern processing units that include multiple processing cores is exploited, thus enabling computations to be performed in parallel (i.e., simultaneously), as described in further detail below. An example of a modern processing unit is shown in FIG. 1B. This figure depicts a multi-core processor 102 comprising four processor cores. The multi-core processor 102 may be, for example, a central processing unit (CPU) or another type of processing unit (e.g., a graphics processing unit (GPU), etc.). The processor cores are coupled to a shared memory 104, which is used to distribute work (e.g., tasks) across the cores. A bus interface 106 enables the multi-core processor 102 to communicate with off-chip components.

The multi-core processor 102 depicted in FIG. 1B is an example, and multi-core processors differ in other examples. For example, although the multi-core processor 102 of FIG. 1B has four processing cores, other processing units may include a different number (e.g., 2, 6, 8, 12, etc.) of cores. Modern desktop computers and laptop computers may include such physical processing cores as well as multiple virtual cores. It is also common for servers and other computer systems to include multiple multi-core processing units. Thus, for a computer system having two multi-core processing units, the number of processing cores may be 2×4, 2×6, 2×8, 2×12, or more, for example.

Figure 1C:
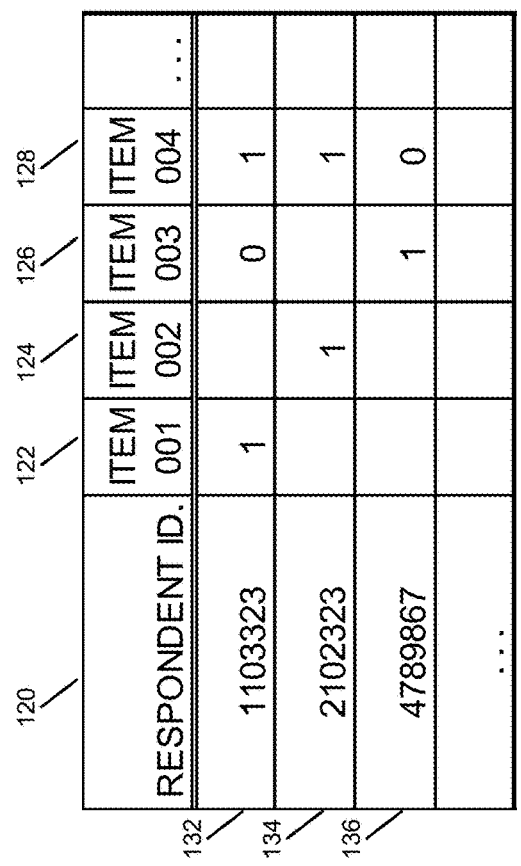
FIG. 1C depicts a parallelizing of the "E-step" of the EM algorithm using the multiple processor cores of the multi-core processor.

As noted above, the analysis of item response data (e.g., the item response data of FIG. 1A) using a generalized latent variable model includes an application of the EM algorithm to the data. In applying the EM algorithm according to the approaches described herein, the E-step (e.g., expectation step) of the algorithm is parallelized using multiple processing cores of one or more processing units (e.g., CPUs). The item response data includes data for multiple respondents, as noted above. The parallelizing of the E-step includes subdividing the multiple respondents into a number of groups that is equal to the number of processing cores to be utilized. To illustrate this, reference is made to FIG. 1C. In the example of FIG. 1C, four processing cores are utilized, and thus, the respondents are subdivided into four groups of respondents. Subsequently, computations for the four groups of respondents are performed in parallel using the four-processor cores, with data for each of the groups being processed by a respective core of the four processor cores. Such computations include, for each of the multiple respondents, calculating the posterior of the latent variable given responses. Additional details on the parallelizing of the E-step are described below.

Figure 1D:
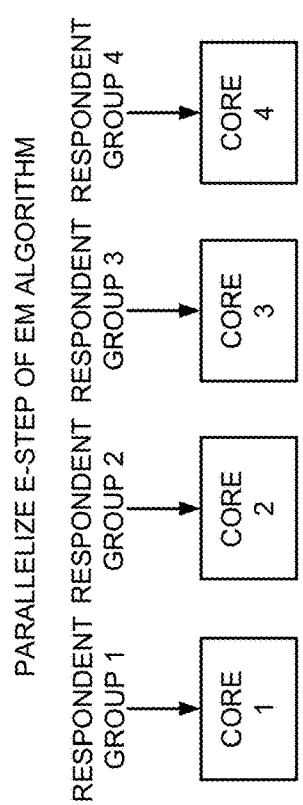
FIG. 1D depicts a parallelizing of the "M-step" of the EM algorithm using the multiple processor cores of the multi-core processor.

The M-step (e.g., maximization step) of the EM algorithm follows the E-step. In applying the EM algorithm according to the approaches described herein, the M-step is parallelized using the multiple processing cores, similar to the parallelizing of the E-step. The item response data includes data for multiple response variables, as noted above. The parallelizing of the M-step includes subdividing the multiple response variables into a number of groups that is equal to the number of processing cores to be utilized. To illustrate this, reference is made to FIG. 1D. As shown in this figure, the response variables are subdivided into four groups of response variables. Subsequently, computations for the four groups of response variables are performed in parallel using the four processor cores, with data for each of the groups being processed by a respective core of the four processor cores. Such computations include, for each response variable of the multiple response variables, updating parameters associated with the response variable. Additional details on the parallelizing of the M-step are described below.

FIGS. 2-9 and their accompanying descriptions herein provide additional details and results on a parallel implementation of the EM algorithm for item multidimensional latent variable models. The developments presented here are based on code that parallelizes both the E-step and the M-step, which is referred to herein as the PEPM algorithm. Examples presented herein include item response theory, diagnostic classification models, multitrait-multimethod (MTMM) models, and discrete mixture distribution models. These types of complex latent variable models are frequently applied to the analysis of multidimensional responses of test takers to a set of items, for example, in the context of proficiency testing. Other examples of models that can be estimated with this algorithm are latent class models, latent regression models, multilevel latent class models, and diagnostic classification models, among others.

The algorithm presented here is based on a direct implementation of massive parallelism using a paradigm that allows the distribution of work onto a number of processor cores. Modern desktop computers as well as many laptops are using processors that contain two to four cores and potentially twice the number of virtual cores. Many servers use two multicore central processing units (CPUs), which brings the number of cores to 2×4 or 2×6, or most recently 2×12 or more. The algorithm presented here scales the time reduction in the most calculation-intense part of the program almost linearly in the number of physical cores, which means that a server with 2×6 (i.e., 12) physical cores executes the parallel E-step algorithm about 10 times faster than a single core computer or the equivalent nonparallel algorithm. The overall gain can reach a reduction in time by a factor close to 6 for a 12-core machine given that there are tasks that cannot be easily done in parallel. The subject matter described herein thus improves the functioning of a computer system as compared to conventional approaches, because the techniques utilized herein enable the analyses of large datasets to be carried out (i) more efficiently (e.g., faster), and (ii) with a reduced processing burden, as compared to the conventional approaches.

In the approaches described herein, the architecture of modern CPUs is utilized, which often involves the design of processors with multiple cores that can run programs simultaneously. The use of this type of architecture for algorithms that produce posterior moments has straightforward appeal: the calculations conducted for each respondent or each distinct response pattern can be split up into simultaneous calculations. Below, a general class of latent variable models is introduced, the general diagnostic model (GDM). Six test cases used in the evaluation of the parallel estimation are also described below. Results of comparisons between the sequential and the parallel approach to latent variable model estimation are described.

The class of general latent variables examined in this disclosure for the purpose of developing a parallel, high-performance estimation approach is the GDM. The GDM provides a framework for the development of diagnostic models. As an item response modeling framework, the probability of an item response $x \in \{0, \ldots, m_i\}$ by respondents $v=1, \ldots, N$ on items $i=1, \ldots, I$ can be written as:

$$P(X = x \mid i, v) = \frac{\exp(f(\lambda_{xi}, \theta_v))}{1 + \sum_{y=1}^{m_i} \exp(f(\lambda_{xi}, \theta_v))}, \tag{1}$$

with item parameters $\lambda_{xi} = (\beta_{xi}, q_i, \gamma_{xi})$ and a skill vector $\theta_v = (a_{v1}, \ldots a_{vK})$ with either continuous, ordinal, or as in the case of the deterministic-input, noisy "and" gate (DINA) model and most other diagnostic models, with binary skill variables $a_{\bullet ak} \in \{0,1\}$. While the general model given in Equation 1 served as the basis for the formal specification of the log-linear cognitive diagnostic model and other developments for binary skill attributes and data, the general form can be used to derive the linear or partial credit GDM:

$$P(X = x \mid i, v) = \frac{\exp\left(\beta_{ix} + \sum_{k=1}^{K} \gamma_{ixk} h(q_{ik}, a_k)\right)}{1 + \sum_{y=1}^{m_i} \exp\left(\beta_{ix} + \sum_{k=1}^{K} \gamma_{ixk} h(q_{ik}, a_k)\right)} \tag{2}$$

with discrete skill $a_{\bullet ak} \in \{a_{k1}, a_{k2}, \ldots, a_{kL_k}\}$, which may be ordinal or binary, and $h(q,a)=qa$ and $\gamma_{ixk}^* = x\gamma_{ik}$ for parsimony. Note that these choices lead to a model that contains located latent class models, multiple classification latent class models, IRT models, and multidimensional IRT models, as well as a compensatory version of the reparameterized unified model as special cases. In addition, the linear GDM as well as the general family are suitable for binary, polytomous ordinal, and mixed format item response data.

The model defined in Equation 2 above uses a weighted linear combination of skill components and is therefore a compensatory model by design, while the general framework given in Equation 1 can be used to define compensatory as well as non-compensatory and conjunctive models. Moreover, models with conjunctive (non-compensatory) skill structure can also be subsumed under the general diagnostic models. More specifically, the DINA and the LCDM can be estimated as special cases of the GDM.

The EM algorithm is used for estimating latent variable models. The name of the algorithm stems from the alternating, iterative repetition of two steps, the E (expectation) step and the M (maximization) step. The estimation of generalized latent variable models using the EM algorithm requires the estimation of expected values for all required sufficient statistics of the structural parameters of the measurement model as well as the estimation of latent variable distributions in one or more populations. In the M-step, the expected values serve as sufficient statistics for the maximization of parameters. The EM algorithm provides expected counts for the unobserved quantities and hence can be used in incomplete data problems. The latent variable(s) are those missing (incomplete) for all respondents, and the distribution of responses in levels of these latent variables are the unknown quantities that have to be supplied by the E-step. These are calculated based on observed data (in psychometric applications, the item response variables and preliminary parameter estimates).

Figure 2:
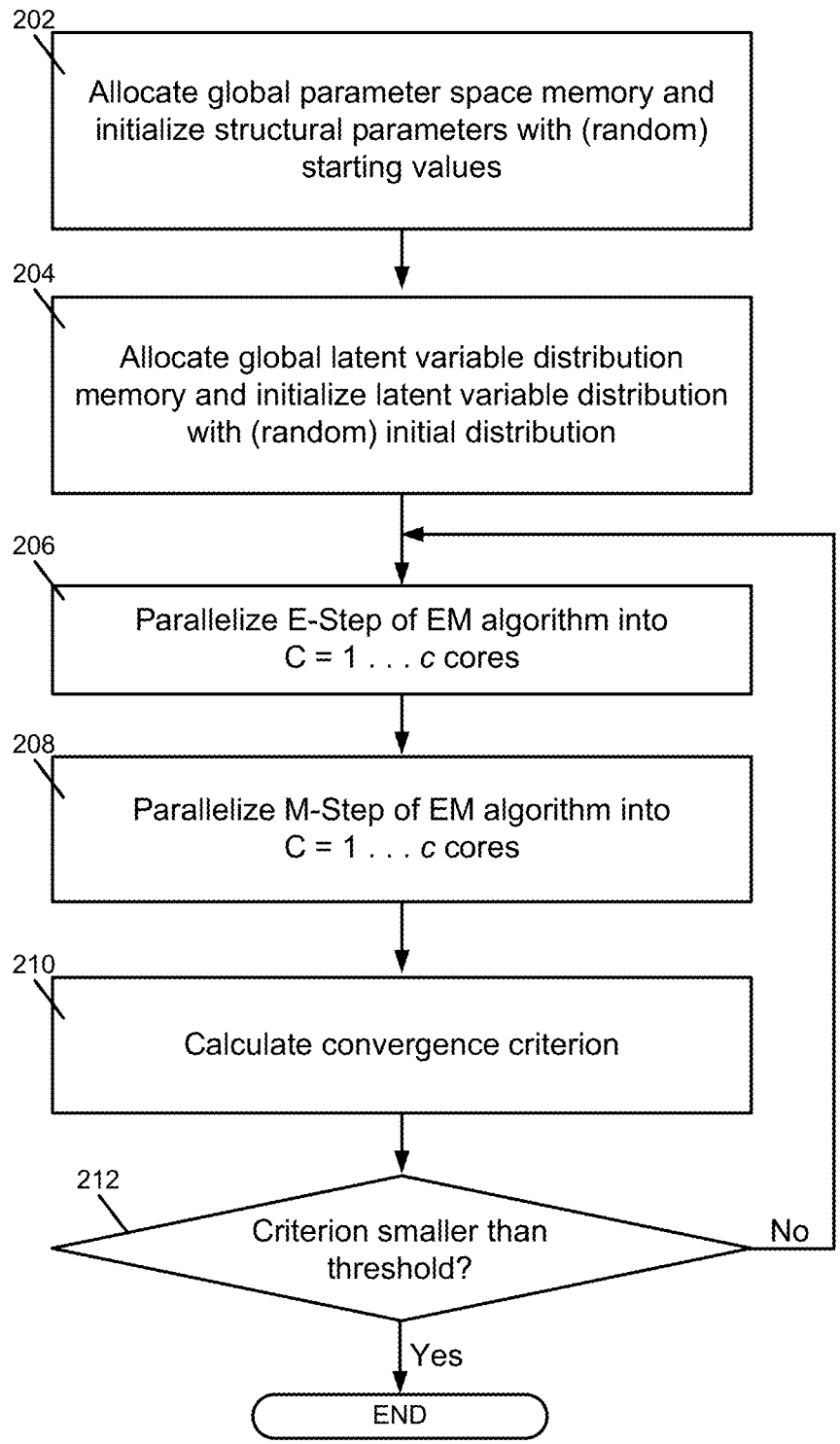
FIG. 2 is a flowchart depicting example steps of a Parallel-E Parallel-M (PEPM) algorithm.

FIG. 2 is a flowchart depicting example steps of a Parallel-E Parallel-M (PEPM) algorithm. The PEPM algorithm described herein is suitable for a range of generalized linear and nonlinear mixed models for multivariate categorical (binary and polytomous) data. At 202, global parameter space memory is allocated, and structural parameters with (random) starting values are initialized. At 204, global latent variable distribution memory is allocated, and a latent variable distribution with (random) initial distribution is initialized. At 206, the E-step of the EM algorithm is parallelized into $C=1 \ldots c$ processor cores. Details of the parallelizing of the E-step are described in further detail below with reference to FIG. 3. At 208, the M-step of the EM algorithm is parallelized into $C=1 \ldots c$ processor cores. Details of the parallelizing of the M-step are described in further detail below with reference to FIG. 3. At 210, convergence criterion is calculated. At 212, a determination is made as to whether the criterion is less than a threshold. If the criterion is not less than the threshold, then the process proceeds back to step 206. If the criterion is less than the threshold, then the process ends.

Figure 3:
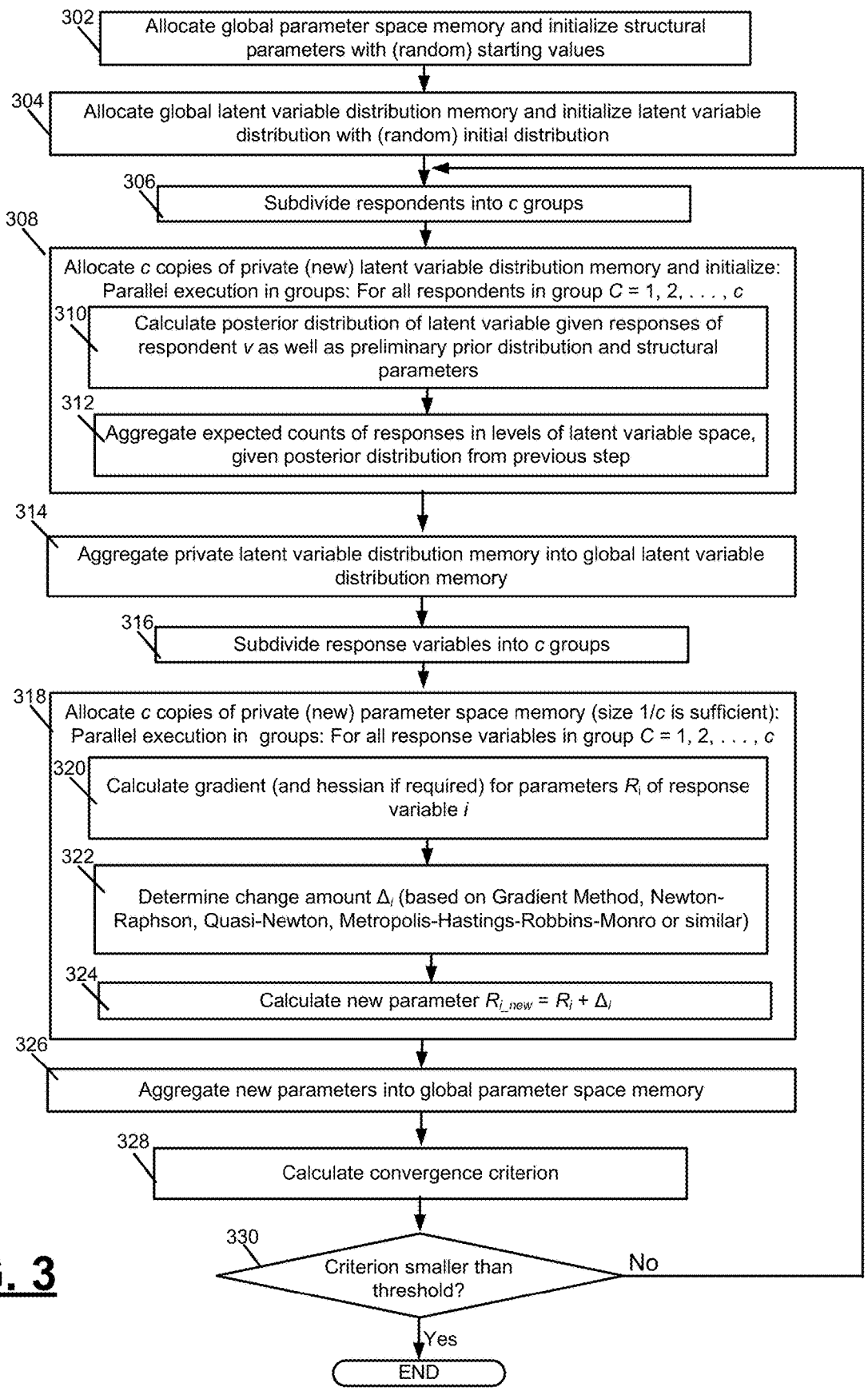
FIG. 3 is a flowchart depicting additional details of the PEPM algorithm of FIG. 2.

FIG. 3 is a flowchart depicting additional details of the PEPM algorithm of FIG. 2. At 302, global parameter space memory is allocated, and structural parameters with (random) starting values are initialized. At 304, global latent variable distribution memory is allocated, and a latent variable distribution with (random) initial distribution is initialized. After the step 304, steps are performed to parallelize the E-step of the EM algorithm into $C=1 \ldots c$ processor cores. These steps include, at 306, subdividing the respondents into c groups. At 308, c copies of private (new) latent variable distribution memory are allocated, and a parallel execution in groups is initialized. In the parallel execution in groups, for all respondents in group $C=1, 2, \ldots, c$, (i) at 310, calculate posterior distribution of latent variable, given responses of respondent v as well as preliminary prior distribution and structural parameters, and (ii) at 312, aggregate expected counts of responses in levels of latent variable space, given posterior distribution from previous step. Next, at 314, the private latent variable distribution memory is aggregated into the global latent variable distribution memory.

After the step 314, steps are performed to parallelize the M-step of the EM algorithm into $C=1 \ldots c$ processor cores. These steps include, at 316, subdividing the response variables into c groups. At 318, c copies of private (new) parameter space memory are allocated (size 1/c is sufficient), and a parallel execution in groups is initialized. In the parallel execution in groups, for all response variables in group $C=1, 2, \ldots, c$, (i) at 320, calculate gradient (and hessian if required) for parameters $R_i = \rho_{i1}, \ldots, \rho_{iD}$ of response variable i, (ii) at 322, determine change amount $\Delta_i$ (based on gradient method, Newton-Raphson, Quasi-Newton, Metropolis-Hastings-Robbins-Monro, or similar), and (iii) at 324, calculate new parameter $R_i^{new} = R_i + \Delta_i$.

At 326, new parameters are aggregated into global parameter space memory. At 328, convergence criterion is calculated. At 330, a determination is made as to whether the criterion is less than a threshold. If the criterion is not less than the threshold, then the process proceeds back to step 306. If the criterion is less than the threshold, then the process ends. The PEPM algorithm discussed herein utilizes parallel processing for both the E-step and M-step, as discussed above. Shared memory in symmetric multiprocessor systems (multicore single or dual CPU) is used to distribute the work across c cores or processes. The memory is distributed and allocated as needed. For the E-step, multiple copies of the memory arrays needed to calculate expectations are allocated and finally aggregated after all parallel processes are concluded. For the M-step, the work is distributed into c processes, each of which generates the quantities needed for execution of a maximization step that updates a subset of structural parameters as assigned to the different processes.

The PEPM algorithm discussed herein does not only speed up the E-step by splitting up and parallelizing computations over many cores for large datasets, but also enables and facilitates efficient estimation of larger multidimensional models while allowing more complex latent structures by parallelizing the M step as well. This means that, in contrast to conventional implementations that did not implement complex latent variable models, the demand for and utilization of parallel algorithms is larger in the algorithm presented here.

Figure 4:
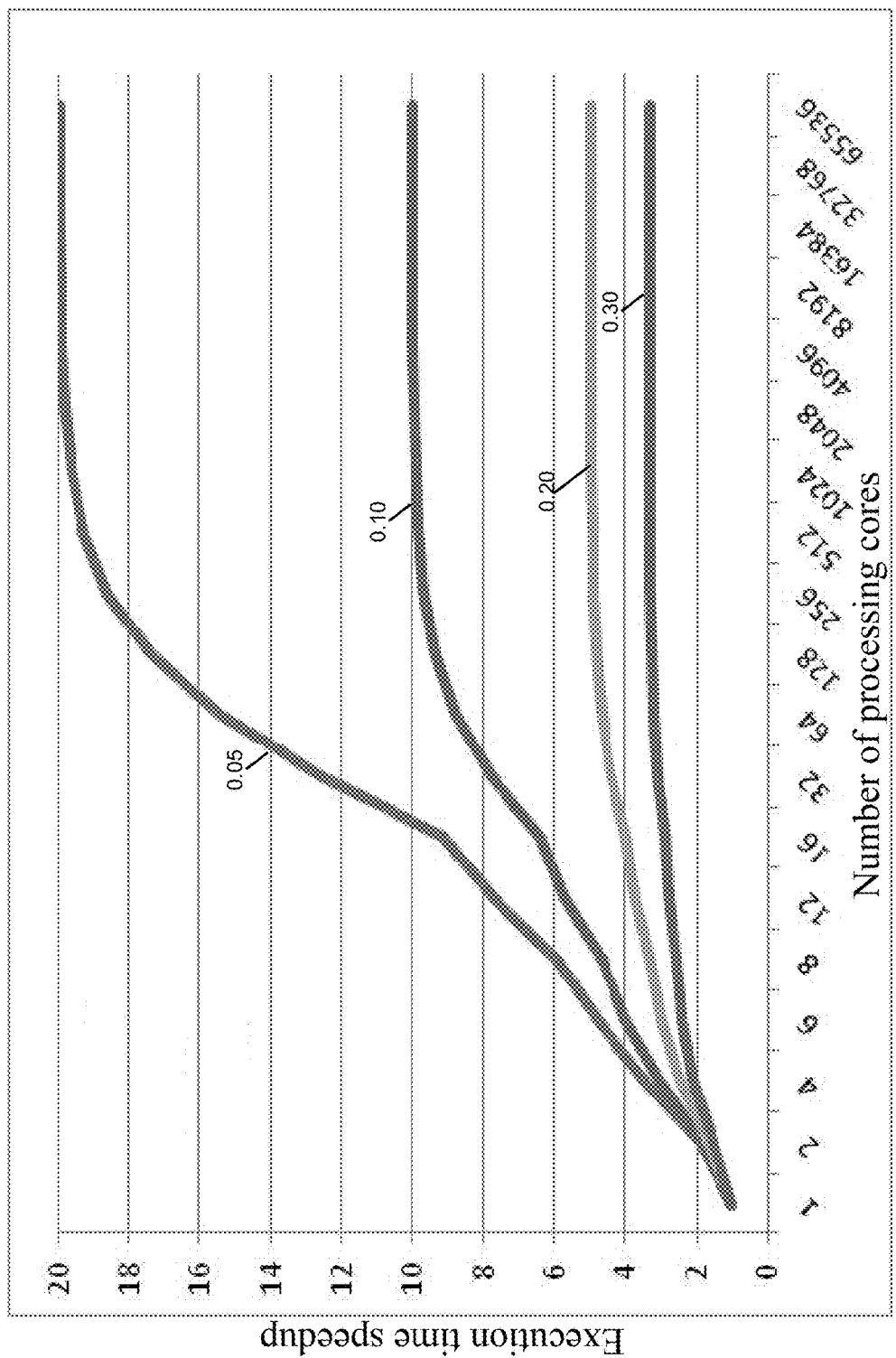
FIG. 4 shows the dependency of the gain on the number of processor cores C for four different level of parallelism.

It is noted that not everything can be parallelized and executed simultaneously on a number of cores. First, the response data has to be loaded into the system. Second, the estimation of the latent structure depends on the combination of results from the subsets of the sample that were submitted to the different cores. Third, results have to be written to files for use in reporting, subsequent analyses, and quality control such as checking convergence of estimation, model fit, etc. These considerations imply that parallelism in computation cannot be 100% in most applications and that the PEPM algorithm will not speed up calculations linearly in the number of processing cores applied. The formal relationship of the percentage of a process or program that can be executed concurrently (i.e., parallel on several computers or cores) and the speedup that can be expected as a function of the number of parallel units was derived. This percentage has to be understood as the relative execution time in a sequential version of the software. For a symmetric multi-core system with C cores, the observation can be expressed as:

$$G = \frac{1}{S + P/C} = \frac{C}{SC + P}, \quad (3)$$

where P=1−S is the proportion of parallel code in the algorithm, and S=1−P is the proportion of sequentially executed code. G is the gain, the ratio of execution time of the serial algorithm relative to the parallel implementation of the algorithm. FIG. 4 shows the dependency of the gain on the number of processor cores C for four different level of parallelism.

Equation 3 can also be used to estimate the percentage of time the algorithm is in parallel mode. This requires solving for P in the equation:

$$G = \frac{1}{(1 - P) + P/C}. \quad (4)$$

Some algebraic transformations yield:

$$\frac{1}{G} = (1 - P) + \frac{P}{C} = 1 + \frac{P}{C} - \frac{PC}{C} = 1 + \frac{P - PC}{C} \quad (5)$$

or $$P = \left(1 - \frac{1}{G}\right)\left(\frac{C}{C - 1}\right) \quad (6)$$

for C>1 and $$\left(1 - \frac{1}{G}\right) < \left(\frac{C}{C - 1}\right).$$

Typically, the exact percentage of parallel sections in the algorithm is an estimate at best. In this case, the relationship may be used to compare the serial and parallel version and obtain an estimate of what percentage of the code was executed in parallel sections.

In order to compare the performance of the parallel implementation and the sequential version, the two algorithms were tested on seven different datasets. Each dataset was analyzed with a latent variable model, ranging from multiple group IRT models utilized for large-scale IRT linking (test cases A, B) to multidimensional discrete latent trait models—sometimes referred to as diagnostic classification models (test case C), to multidimensional IRT models (D, E), and finally latent class models (test case F). The differences between the test cases are summarized in FIG. 5 to give an impression of the range of estimation problems for which the systems and methods described herein are suitable. It was the main aim of this comparison to examine moderate to very large sample sizes, as the relative gain of a parallel implementation using small datasets can only be marginal. This is because the estimation of model parameters and latent distributions tends to be rather swift if sample sizes are small, so that input and output will take up more time than the actual computations needed to obtain parameter estimates.

As shown in FIG. 5, test cases A and B contain data from U.S. Pat. Nos. 1,614,281 and 1,803,599 respondents, respectively, which are based on data collected across 4 cycles for test case A and 5 cycles for B of an international large-scale assessment of student outcomes. Each cycle contains between 50 and 80 samples from different countries, or country-by-language groups for countries with more than one official language, with a total of 312 estimated population distributions for case A and 283 populations for case B. The number of items, sampled in an incomplete block design (Mazzeo & von Davier, 2014), is 293 for test case A and 133 for test case B. Each distribution of the skill variable in these groups is represented using 21 quadrature points.

Test case C is based on an innovative assessment that was aimed at assessing process skills and content knowledge simultaneously. Each item taps into multiple (two) out of seven skills and knowledge variables. The model used on this dataset is best described as a polytomous diagnostic model (each attribute variable has three levels) with a multitrait-multimethod (MTMM) structure. The number of items is 214, there is a single population, and the sample size is 7,377. The size (number of different possible attribute patterns) of the latent structure is 2,187, and the structure was modeled using a log-linear approach.

Test cases D and E are based on the same dataset, analyzed using a multidimensional IRT model, based on data from N=5,763 students who were part of a longitudinal extension of a large-scale assessment. The only difference between the two test cases is the size of the latent structure. In case D, each dimension is defined based on 15 quadrature points, resulting in 225 nodes, while case E uses 31 quadrature points each, giving rise to a latent structure of 961 nodes.

Case F is based on an application of latent class analysis (LCA) for developing a set of conditioning variables, not dissimilar to the use of LCA for imputations. This particular dataset is based on publicly available international large-scale assessment data. The number of latent classes is 54, each of which can be represented by a different set of parameters for the response variables. The sample size for case F is 246,112. Testcase G is a 5-dimensional MIRT model with simple structure for a dataset based on 150 items and 2026 respondents.

Results depicted in FIGS. 6-8 focus on a comparison of time needed for the most time-consuming part of the runs, the actual estimation of latent distributions and latent expected response frequencies in the levels of the distribution that are calculated as expected values given preliminary item parameters in the E-step. For comparisons, two machines were employed to run all test cases, once with the sequential version and once with the parallel version of the GDM software. More specifically, the runtime advantage of the parallel software was evaluated using an Apple Macbook Air 2012 with 8 GB RAM, and a 2 GHZ i7 4-core Intel processor as well as a 2012 Dell Precision T5500 Workstation with dual X5680 CPU with 2×6 cores and a clock frequency of 3.33 GHZ, and 24 GB RAM. To preempt any considerations of RAM needed, both machines had sufficient amounts of unallocated RAM even when running the largest datasets from test cases A and B.

FIG. 6 shows the results for the i7 nonparallel and parallel versions of the algorithm for all test cases. The table shows the number of iterations needed, the log-likelihood after convergence, and the time taken in seconds by the two variants of the algorithm. The speedup can reach factor 2 or more, which would relate to a proportion of parallelism of 73% or so. Note however that the i7 processor supports vectored processing of some instructions, and that the sequential program was compiled with advanced optimization switched on. Therefore, the actual degree of parallelism is likely higher than 73%. Note also that the parallel E-step and the parallel M-step have some overhead and require accumulation of partial sums in the shared memory space to obtain expected values based on the full sample. On average across these somewhat arbitrary selections of examples, there is a speedup by a factor of 1.64.

FIG. 7 shows the results for the comparison between parallel and serial EM algorithms using the 12-core Xeon 3.33 GHz workstation. The main result appears to be that the Xeon-based runs are sped up by a factor that ranges from 2.4 to 6.8 when moving to parallel processing. Closer inspection reveals that the serial version of the algorithm requires more time on the Xeon than on the i7 in three cases, about the same time in one case, and less time in two cases, while the parallel version appears to be faster on the Xeon in all instances. The average speedup is 4.69. This is equivalent to a level of parallelism of 86% according to Amdahl's law. This means that there may be room for improvement by further reducing the sequential portion of 14%.

The question of whether there is an advantage of using a workstation with multiple CPUs—in the examples a 12-core Xeon 3.33 GHz PC—over the laptop, a 4-core i7 with speed boost 2.7 Ghz, can be examined based on the ratio of times used for the parallel algorithm. FIG. 8 gives a summary of these results for the six test cases. It can be seen that the workstation with 12 cores is faster in all cases, so that moving analytic work from a 4-core laptop to a 12-core PC pays off. The highest gain in speed is seen for cases B and D, where the speedup is by a factor of 1.04 and 3.75, respectively. The average speedup is 2.15.

As shown herein, there is strong evidence that parallel programming can be valuable for psychometric analyses of large datasets with modern latent variable models. The examples provided show that the PEPM algorithm for multidimensional latent variable models can provide much-needed speedup when analyzing data on shared memory multiprocessor systems. The fact that practically every recent PC or laptop has some form of multicore processor implies that most analyses can be conducted in about 50% of the time required compared to nonparallel versions of the algorithm. In dedicated workstations with multiple CPUs, each of which provide four, six, or even eight cores, the speedup is even more significant.

This result gains importance once it is understood that all analyses with latent trait models except for the most basic and naïve ones require extensive quality control and iterative modeling decisions. Each complex dataset likely contains response variables or respondents that cannot be appropriately fitted with the initial model. In international databases, each response variable is based on an item that was presented in a variety of translations, so there is always room for translation issues that may change the meaning, and hence the difficulty, of the items. This may lead to the need to adjust parameterizations and to release equality constraints. Other sources of model misfit that may require iterative refinements of model constraints are position and context effects. These issues result in the need to not just run one model once and be done with it, but rather to start with a null model that assumes the highest level of constraints and iteratively rerun models with fewer following the evaluation of model data fit. This common analytic requirement to run several estimations underlines the importance of a speedup of analysis that often reduces the time required from 90 minutes or more to 15 minutes or less.

The advantage in execution speed is significant with no consequences that impact the accuracy of the results. All test cases converge to the same parameters and latent variable distributions. The log-likelihood is identical up to the fifth or sixth decimals even in cases with about 2,000,000 response vectors. This is not an error introduced by the parallel implementation, but rather an effect that is due to numerical calculations and, in particular, summation with finite accuracy. In numerical calculations, addition, strictly speaking, is not commutative: for very long sums, that is, those we encounter when calculating the log-likelihood of the data across individual students for about 2,000,000, the sequence of additions may make a (very small, not practically relevant) difference. If the Gilula-Haberman (1994) log-penalty would be used instead, the resulting average likelihood per response would be the same for the first 16 or more decimals. In all cases, the same number of iterations was needed for all implementations and hardware combinations, and the estimated latent variable distributions and item parameters were identical.

The advantages of parallel implementation for psychometric modeling and estimation are profound. Instead of relying on subsamples and/or simplifications based on the model structure or computational approximations, parallel computing for psychometric modeling with general latent variable models can provide analyses based on the full data without shortcuts. A move to special-purpose hardware for further speedup of the algorithm presented here appears to be straightforward. Parallel algorithms can utilize special purpose graphical processing units (GPUs), which provide a much larger number of specialized cores or alternatively make use of multicore coprocessors (such as the Xeon-Phi series) for further speedup. However, even on a customary laptop or notebook computer, significant increases in estimation speed can be gained by applying the PEPM algorithm described herein.

Figure 9:
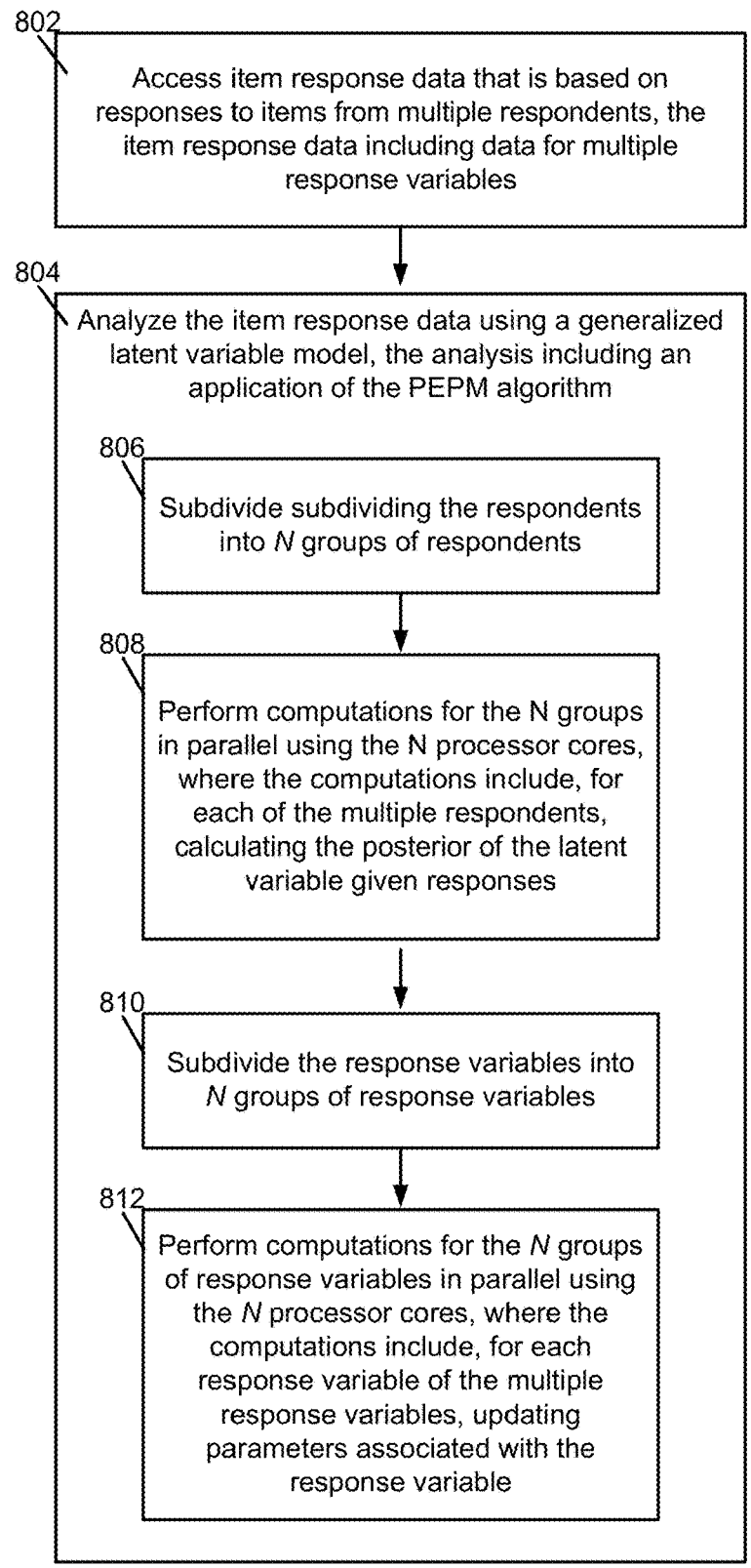
FIG. 9 is a flowchart depicting operations of an example method performed in a computer system including N processor cores.

FIG. 9 is a flowchart depicting operations of an example method performed in a computer system including N processor cores. At 802, item response data that is based on responses to items from multiple respondents is accessed. The item response data includes data for multiple response variables. At 804, the item response data is analyzed using a generalized latent variable model, and the analysis includes an application of the PEPM algorithm. In a parallel Expectation step of the PEPM algorithm, at 806, the respondents are subdivided into N groups of respondents, and at 808, computations for the N groups are performed in parallel using the N processor cores. Data for each of the N groups is processed by a respective core of the N processor cores, where the computations include, for each of the multiple respondents, calculating the posterior of the latent variable given responses. In a parallel Maximization step of the PEPM algorithm, at 810, the response variables are subdivided into N groups of response variables, and at 812, computations for the N groups of response variables are performed in parallel using the N processor cores. Data for each of the N groups is processed by a respective core of the N processor cores, where the computations include, for each response variable of the multiple response variables, updating the parameters associated with each response variable.

This written description uses examples to disclose the invention, including the best mode, and also to enable a person skilled in the art to make and use the invention. The patentable scope of the invention includes other examples. Additionally, the methods and systems described herein may be implemented on many different types of processing devices by program code comprising program instructions that are executable by the device processing subsystem. The software program instructions may include source code, object code, machine code, or any other stored data that is operable to cause a processing system to perform the methods and operations described herein. Other implementations may also be used, however, such as firmware or even appropriately designed hardware configured to carry out the methods and systems described herein.

The systems' and methods' data (e.g., associations, mappings, data input, data output, intermediate data results, final data results, etc.) may be stored and implemented in one or more different types of computer-implemented data stores, such as different types of storage devices and programming constructs (e.g., RAM, ROM, Flash memory, flat files, databases, programming data structures, programming variables, IF-THEN (or similar type) statement constructs, etc.). It is noted that data structures describe formats for use in organizing and storing data in databases, programs, memory, or other computer-readable media for use by a computer program.

The computer components, software modules, functions, data stores and data structures described herein may be connected directly or indirectly to each other in order to allow the flow of data needed for their operations. It is also noted that a module or processor includes but is not limited to a unit of code that performs a software operation, and can be implemented for example as a subroutine unit of code, or as a software function unit of code, or as an object (as in an object-oriented paradigm), or as an applet, or in a computer script language, or as another type of computer code. The software components and/or functionality may be located on a single computer or distributed across multiple computers depending upon the situation at hand.

It should be understood that as used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Further, as used in the description herein and throughout the claims that follow, the meaning of "each" does not require "each and every" unless the context clearly dictates otherwise. Finally, as used in the description herein and throughout the claims that follow, the meanings of "and" and "or" include both the conjunctive and disjunctive and may be used interchangeably unless the context expressly dictates otherwise; the phrase "exclusive of" may be used to indicate situations where only the disjunctive meaning may apply.

It is claimed:

1. A computer-implemented method performed in a computer system including N processor cores, where N is greater than one, the method comprising:
   accessing response data that is based on responses to test questions from multiple test-takers, the response data including data for multiple response variables; and
   analyzing the response data using a generalized latent variable model, the analysis including an application of a parallel Expectation parallel Maximization (PEPM) algorithm,
   wherein a parallel Expectation step of the PEPM algorithm includes: subdividing the test-takers into N groups of test-takers, and
     performing computations for the N groups in parallel using the N processor cores, data for each of the N groups being processed by a respective core of the N processor cores, wherein the computations include, for each of the multiple test-takers, calculating the posterior of the latent variable given responses; and
   wherein a parallel Maximization step of the PEPM algorithm includes: subdividing the response variables into N groups of response variables, and
     performing computations for the N groups of response variables in parallel using the N processor cores, data for each of the N groups being processed by a respective core of the N processor cores, wherein the computations include, for each response variable of the multiple response variables, updating parameters associated with the response variable,
   wherein results of the PEPM algorithm are utilized to provide a score to a new response received from a new test-taker, the score estimating a skill of the new test-taker.

2. The method of claim 1, wherein the response data includes no data or an indication of no data for certain response variables for certain test-takers.

3. The method of claim 1, further comprising: selecting the value N based on a number of processor cores available for performing the method.

4. The method of claim 3, wherein N is selected based on a number of processor cores present on a computing machine.

5. The method of claim 1, further comprising:
   computing a convergence criteria value;
   comparing the convergence criteria value to a threshold; and
   re-performing the parallel Expectation step and the parallel Maximization step based on said comparing.

6. The method of claim 1, wherein the PEPM algorithm is performed using a graphics processing unit (GPU).

7. The method of claim 1, wherein the score is used to estimate the skill of the new test-taker based on an item response theory analysis.

8. The method of claim 7, wherein the score is provided such that each of a plurality of new responses does not have an identical contribution to the score because each of the plurality of new responses does not have an identical relevance to the score.

9. A system comprising:
   a processing system including N processor cores, N being greater than one; and
   one or more non-transitory computer-readable storage mediums in communication with the processing system and encoded with instructions for commanding the processing system to execute steps comprising:
     accessing response data that is based on responses to test questions from multiple test-takers, the response data including data for multiple response variables; and
     analyzing the response data using a generalized latent variable model, the analysis including an application of a parallel Expectation parallel Maximization (PEPM) algorithm,
   wherein a parallel Expectation step of the PEPM algorithm includes: subdividing the test-takers into N groups of test-takers, and
     performing computations for the N groups in parallel using the N processor cores, data for each of the N groups being processed by a respective core of the N processor cores, wherein the computations include, for each of the multiple test-takers, calculating the posterior of the latent variable given responses; and
   wherein a parallel Maximization step of the PEPM algorithm includes:
     subdividing the response variables into N groups of response variables, and
     performing computations for the N groups of response variables in parallel using the N processor cores, data for each of the N groups being processed by a respective core of the N processor cores, wherein the computations include, for each response variable of the multiple response variables, updating parameters associated with the response variable, wherein results of the PEPM algorithm are utilized to provide a score to a new response received from a new test-taker, the score estimating a skill of the new test-taker.

10. The system of claim 9, wherein the response data includes no data or an indication of no data for certain response variables for certain test-takers.

11. The system of claim 9, wherein the steps further include: selecting the value N based on a number of processor cores available for performing the method.

12. The system of claim 11, wherein N is selected based on a number of processor cores present on a computing machine.

13. The system of claim 9, wherein the steps further include:
computing a convergence criteria value;
comparing the convergence criteria value to a threshold; and
re-performing the parallel Expectation step and the parallel Maximization step based on said comparing.

14. The system of claim 9, wherein the PEPM algorithm is performed using a graphics processing unit (GPU).

15. The system of claim 9, wherein the score is used to estimate the skill of the new test-taker based on an item response theory analysis.

16. The system of claim 15, wherein the score is provided such that each of a plurality of new responses does not have an identical contribution to the score because each of the plurality of new responses does not have an identical relevance to the score.

17. A non-transitory computer-readable storage medium comprising computer executable instructions which, when executed, cause a processing system including N processor cores to execute steps comprising:

accessing response data that is based on responses to test questions from multiple test-takers, the response data including data for multiple response variables; and analyzing the response data using a generalized latent variable model, the analysis including an application of a parallel Expectation parallel Maximization (PEPM) algorithm, wherein a parallel Expectation step of the PEPM algorithm includes: subdividing the test-takers into N groups of test-takers, N being greater than one, and performing computations for the N groups in parallel using the N processor cores, data for each of the N groups being processed by a respective core of the N processor cores, wherein the computations include, for each of the multiple test-takers, calculating the posterior of the latent variable given responses; and wherein a parallel Maximization step of the PEPM algorithm includes:

subdividing the response variables into N groups of response variables, and performing computations for the N groups of response variables in parallel using the N processor cores, data for each of the N groups being processed by a respective core of the N processor cores, wherein the computations include, for each response variable of the multiple response variables, updating parameters associated with the response variable, wherein results of the PEPM algorithm are utilized to provide a score to a new response received from a new test-taker, the score estimating a skill of the new test-taker.

* * * * *